US006850111B1

(12) United States Patent
Ausserlechner

(10) Patent No.: US 6,850,111 B1
(45) Date of Patent: Feb. 1, 2005

(54) CHARGE PUMP CIRCUIT

(75) Inventor: Udo Ausserlechner, Villach (AT)

(73) Assignee: Infineon Technologies AG, Munich (DE)

( * ) Notice: Subject to any disclaimer, the term of this patent is extended or adjusted under 35 U.S.C. 154(b) by 26 days.

(21) Appl. No.: 10/390,874

(22) Filed: Mar. 17, 2003

Related U.S. Application Data

(63) Continuation of application No. PCT/DE01/03427, filed on Sep. 6, 2001.

(30) Foreign Application Priority Data

Sep. 15, 2000 (DE) .......................... 100 45 693

(51) Int. Cl.⁷ ............................... G05F 3/02
(52) U.S. Cl. ........................ 327/536; 363/59
(58) Field of Search ............... 327/536, 537; 363/59

(56) References Cited

U.S. PATENT DOCUMENTS

| | | | | |
|---|---|---|---|---|
| 4,199,806 A | * | 4/1980 | Patterson, III ............... | 363/60 |
| 4,922,403 A | * | 5/1990 | Feller ........................... | 363/60 |
| 5,059,815 A | | 10/1991 | Bill et al. | |
| 5,066,871 A | | 11/1991 | Wilcox | |
| 5,339,236 A | * | 8/1994 | Tamagawa .................... | 363/59 |
| 5,612,828 A | | 3/1997 | Brannon et al. | |
| 5,635,776 A | * | 6/1997 | Imi ............................. | 307/110 |
| 5,790,393 A | * | 8/1998 | Fotouhi ....................... | 363/60 |
| 5,818,290 A | * | 10/1998 | Tsukada ...................... | 327/537 |
| 5,963,025 A | | 10/1999 | Colli | |
| 6,175,262 B1 | * | 1/2001 | Savelli et al. ................ | 327/536 |
| 6,456,151 B1 | * | 9/2002 | Pontarollo ................... | 327/536 |
| 6,483,377 B2 | * | 11/2002 | White et al. ................. | 327/536 |
| 6,525,595 B2 | * | 2/2003 | Oku ............................ | 327/536 |

FOREIGN PATENT DOCUMENTS

| | | |
|---|---|---|
| DE | 26 21 684 A1 | 12/1977 |
| DE | 223 031 A1 | 5/1985 |
| EP | 0 630 051 A1 | 12/1994 |
| GB | 2 312 576 A | 10/1997 |
| JP | 2000-66747 | 3/2000 |
| JP | 2000175441 | 6/2000 |
| JP | 2000-184697 | 6/2000 |
| JP | 2000236657 | 8/2000 |

OTHER PUBLICATIONS

Keuter, W. et al.: "Optimierte Ansteuerung heutiger Darlington–Leistungstransisforen" [Optimal Control of Today's Darlington–Power Transistors], Leistungselektronik, Bd. 108, Ed. 19, 1987, pp. 914–916, 918–920.

* cited by examiner

Primary Examiner—Terry D. Cunningham
(74) Attorney, Agent, or Firm—Laurence A. Greenberg; Werner H. Stemer; Ralph E. Locher

(57) ABSTRACT

A charge pump circuit provides an output voltage greater than a supply voltage of the charge pump circuit. The charge pump circuit has a first and a second charge storage device driven and connected up to one another such that the output voltage is higher than the dielectric strength of the individual capacitors. Switching devices are alternately switched on and off dependent on a high-frequency signal, so that the first charge storage device is charged during a first clock phase and the charge of the first charge storage device is transferred to the second charge storage device during a second clock phase. The charge pump circuit is distinguished by a low current demand, high output voltages and the provision of an output voltage with a low internal resistance. In a preferred embodiment, the switching devices have bipolar transistors, equipped with anti-saturation circuits.

7 Claims, 6 Drawing Sheets

CHARGE PUMP CIRCUIT

CROSS-REFERENCE TO RELATED APPLICATION

This application is a continuation of copending International Application No. PCT/DE01/03427, filed Sep. 6, 2001, which designated the United States and was not published in English.

BACKGROUND OF THE INVENTION

Field of the Invention

The present invention relates to a charge pump circuit.

Charge pump circuits provide an output voltage that is greater than a supply voltage being fed to the charge pump circuit.

In electronic systems, it is often necessary to provide a supply voltage for circuit sections such that the supply voltage is higher than the actual operating voltage of the electronic system. Charge pump circuits can be used for this purpose.

U.S. Pat. No. 5,066,871 teaches the principle of a charge pump circuit and also realizations using CMOS (Complementary Metal Oxide Semiconductor) technology and using bipolar circuit technology. In the document, a capacitor is provided which, by its terminals, is on the one hand connected to a supply potential and on the other hand can be connected in switchable fashion to ground or the supply potential.

U.S. Pat. No. 5,059,815 teaches a charge pump constructed using CMOS technology and having a cascade structure. In this case, two charge pump circuits, which each include a charge storage device formed as a capacitor in series with a variable-capacitance diode, are connected in cascade. However, this circuit is only suitable for small voltages if standard CMOS components are used.

CMOS (Complementary Metal Oxide Semiconductor) technology for realizing charge pump circuits, for example, in automotive engineering, has the disadvantage that such charge pump circuits have comparatively poor breakdown properties in the context of voltage spikes that occasionally occur.

The charge pump circuit constructed using bipolar technology which is specified in U.S. Pat. No. 5,066,871 has improved performance with regard to voltage spikes that occur, but has the disadvantage that fast switch-off or fast switching times are not possible in this charge pump circuit on account of saturation effects that can usually occur in bipolar transistors. A circuit is specified which merely avoids a particularly high degree of saturation of the NPN transistors in the charge pump circuit.

Published German Patent DE 2621694 specifies a voltage doubling circuit having an input, an output, two diodes, two charge storage devices and two circuit transistors connected together such that the output voltage approximately corresponds to twice the input voltage. In this case, the dielectric strength of the charge storage devices used has to be greater than the input voltage.

SUMMARY OF THE INVENTION

It is accordingly an object of the invention to provide a charge pump circuit which overcomes the above-mentioned disadvantages of the prior art apparatus of this general type.

In particular, it is an object of the invention to disclose a charge pump circuit that provides a voltage that is greater than the sum of the dielectric strengths of the charge storage devices used.

With the foregoing and other objects in view there is provided, in accordance with the invention, a charge pump circuit for providing an output voltage that is greater than a supply voltage. The charge pump circuit includes: a first diode; a circuit node; a terminal for acquiring an input voltage; a first charge storage device coupled, via the first diode to the terminal for acquiring the input voltage, the first charge storage device also coupled to the circuit node; a terminal for acquiring the supply potential; a terminal for acquiring a reference-ground potential; a second diode; a terminal for providing an output voltage; a second charge storage device coupled to the terminal for acquiring the supply potential, the second charge storage-device coupled, via the second diode, to the first charge storage device, the second charge storage device connected to the terminal for providing the output voltage; a first switching device coupled to the terminal for acquiring the supply potential and to the circuit node; a second switching device connected to the terminal for acquiring a reference-ground potential and to the circuit node; and a terminal for acquiring a high-frequency signal for controlling the first switching device and the second switching device. The first switching device includes a bipolar transistor. The first switching device is coupled to the terminal for acquiring the high-frequency signal for controlling the first switching device and the second switching device. The second switching device is coupled to the terminal for feeding in the high-frequency signal for controlling the first switching device and the second switching device.

In accordance with an added feature of the invention, the first diode is connected to be forward biased between the terminal for acquiring the input voltage and the first charge storage device; and the second diode is connected to be forward biased between the first charge storage device and the second charge storage device.

In accordance with an additional feature of the invention, there is provided, a first anti-saturation circuit including the first switching device, the first switching device including a bipolar transistor; and a second anti-saturation circuit including the second switching device, the second switching device including a bipolar transistor.

In accordance with another feature of the invention, there is provided, a drive circuit. The bipolar transistor of the first anti-saturation circuit is designed as a switching amplifier having a control input connected to the drive circuit. The bipolar transistor of the second anti-saturation circuit is designed as a switching amplifier having a control input connected to the drive circuit. The drive circuit is configured for acquiring the high-frequency signal for alternately switching on the bipolar transistor of the first anti-saturation circuit and the bipolar transistor of the second anti-saturation circuit.

In accordance with a further feature of the invention, there is provided, a high-voltage protection device for protecting against high voltages. The high-voltage protection device has a control input for acquiring an auxiliary voltage. The high-voltage protection device connects the drive circuit to the terminal for acquiring the supply voltage.

In accordance with further added features of the invention: the bipolar transistor of the first anti-saturation circuit includes a base terminal and a collector terminal; the bipolar transistor of the second anti-saturation circuit includes a base terminal and a collector terminal; the first anti-saturation circuit includes two diodes connected back to back between the base terminal and the collector terminal of the bipolar transistor of the first anti-saturation circuit; the second anti-saturation circuit includes two diodes connected back to back between the base terminal and the collector terminal of the bipolar transistor of the second anti-saturation circuit; and the first anti-saturation circuit and the second anti-saturation circuit are connected to the drive circuit.

In accordance with a further additional feature of the invention, a resistor is connected between the base terminal of the bipolar transistor of the first anti-saturation circuit and the terminal for acquiring the supply potential.

In accordance with yet an added feature of the invention, there is provided, a terminal for acquiring an auxiliary voltage; and a current mirror connected to the base terminal of the transistor of the first anti-saturation circuit and to the terminal for acquiring the supply voltage. The current mirror is also coupled to the terminal for acquiring the auxiliary voltage.

In accordance with yet an additional feature of the invention, the first charge storage device includes a dielectric and two polysilicon regions isolated from one another by the dielectric; and the second charge storage device includes a dielectric and two polysilicon regions isolated from one another by the dielectric of the second charge storage device.

The supply voltage is the voltage difference between the supply potential and the reference-ground potential.

The input voltage of the charge pump circuit is usually in the region of a few volts. Consequently, the first charge storage device may be designed as a capacitor having a low dielectric strength. The second charge storage device likewise experiences a low voltage loading since merely the difference voltage between output voltage and supply voltage is dropped across the second charge storage device. Consequently, the charge storage devices can be realized and operated with a small area requirement and a low current demand. Moreover, high failure safeguards of the charge storage devices, caused by overvoltage spikes in the supply voltage, are expected on account of the low voltage loading of the charge storage devices. By way of example, when the charge pump circuit is used in automotive engineering applications, large voltage spikes and fluctuations of the supply voltage are expected, for example, on account of starting, bridging or switching operations on a motor vehicle. The charge pump circuit described can generate an output voltage that is greater than the dielectric strength of the individual charge storage devices. The output voltage approximately corresponds to the sum of input voltage and supply voltage.

The input voltage is preferably less than the supply voltage.

By way of example, the input voltage may be 4 V and the supply voltage may be 25 V. The present circuit can then provide an output voltage of approximately 28 V even though, in the present example, the two charge storage devices only have a dielectric strength of 12 V.

In one advantageous embodiment of the present invention, a diode is connected in the forward direction between the terminal for the input voltage and the first charge storage device and another diode is connected between the first charge storage device and the second charge storage device. The diodes enable a simple way of a charging of the first charge storage device with the input voltage during a first clock phase and transferring the charge stored in the first charge storage device into the second charge storage device during a second clock phase.

In a further preferred embodiment of the present invention, first and second switching devices each include a bipolar transistor to which a first and second anti-saturation circuit, respectively, is connected. When bipolar transistors are used for switching between first and second clock phases of the charge pump circuit, the anti-saturation circuits prevent the bipolar transistors from attaining saturation and, consequently, the current consumption of the circuit can be reduced and the pump frequency that can be fed with the high-frequency signal can be increased.

In a further advantageous embodiment of the present invention, a drive circuit is connected to control inputs of the bipolar transistors, to which drive circuit the high-frequency signal can be fed for alternately switching on the bipolar transistors designed as switching amplifiers. If the high-frequency signal is a square-wave signal, then the first bipolar transistor can be switched on and the second bipolar transistor can be switched off during a first clock phase of the square-wave signal, and vice versa during the second clock phase.

In a further advantageous embodiment of the present invention, a high-voltage protection device for protecting the drive circuit against high voltages is provided. An auxiliary voltage can be fed at a control input of the high-voltage protection device, and the high-voltage protection device connects the drive circuit to the terminal for the supply voltage. Merely a high-voltage-resistant bipolar transistor may suffice for realizing the device for protecting against high voltages, thereby ensuring that circuit sections whose potential is less, for example, switches and current sources of the drive circuit, can be realized with current-saving and area-saving standard CMOS components. This may be advantageous, for example, when the charge pump circuit is used in applications susceptible to overvoltages, for example, in the automotive sector.

In a further advantageous embodiment of the present invention, the anti-saturation circuits each include two diodes which are connected back to back and are connected between the base terminal and the collector terminal of the bipolar transistors of the switching devices. The diodes in each case are connected to the drive circuit at their connection node. This prevents the bipolar transistors which are operated in a common-emitter connection from having a negative collector-base voltage. Consequently, not only a deep saturation of the transistors, but even a slight saturation of the transistors is avoided. First, this enables a high pump frequency and, second, such an effective saturation circuit reduces the current consumption of the charge pump circuit by the product of the saturation charge and the pump frequency. The simultaneously avoided injection of substrate current, in particular at high temperatures, further reduces the current consumption of the circuit. The diodes may in part be replaced by resistors or by further transistors. Each of the diodes may be replaced by a series circuit including a plurality of diodes.

In a further advantageous embodiment of the present invention, a resistor is connected between the base terminal of the transistor of the second switching device and the terminal for the supply potential. The resistor may advantageously be designed with a high resistance and enables the transistor of the second switching device to be switched off reliably.

In a further preferred embodiment of the present invention, there may be provided, instead of the resistor, a current mirror which is connected to the terminal for the supply potential and to the base terminal of the transistor of the second switching device and is coupled to the terminal for the auxiliary voltage. The realization of the reliable switch-off of the relevant transistor, designed as a switching amplifier, with further transistors instead of a resistor can enable the bipolar transistor to be switched off more rapidly.

In a further advantageous embodiment of the present invention, the charge storage devices in each case include two polysilicon regions that are isolated from one another by a dielectric. So-called poly-poly capacitors have a particularly small area requirement and, moreover, can be connected up by their first terminal to the terminal for the output voltage of the charge pump circuit. This enables an additional utilization of leakage capacitances with respect to the substrate or reference-ground potential terminal of the circuit, which may amount to, for example, 10% of the nominal capacitance. In this case, the leakage capacitance between the first charge storage device and the reference-ground potential terminal acts as an additional smoothing capacitor.

Other features which are considered as characteristic for the invention are set forth in the appended claims.

Although the invention is illustrated and described herein as embodied in a charge pump circuit, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

In the descriptions of the figures below, identical reference symbols designate mutually corresponding structural parts or functional blocks.

Figure 1:
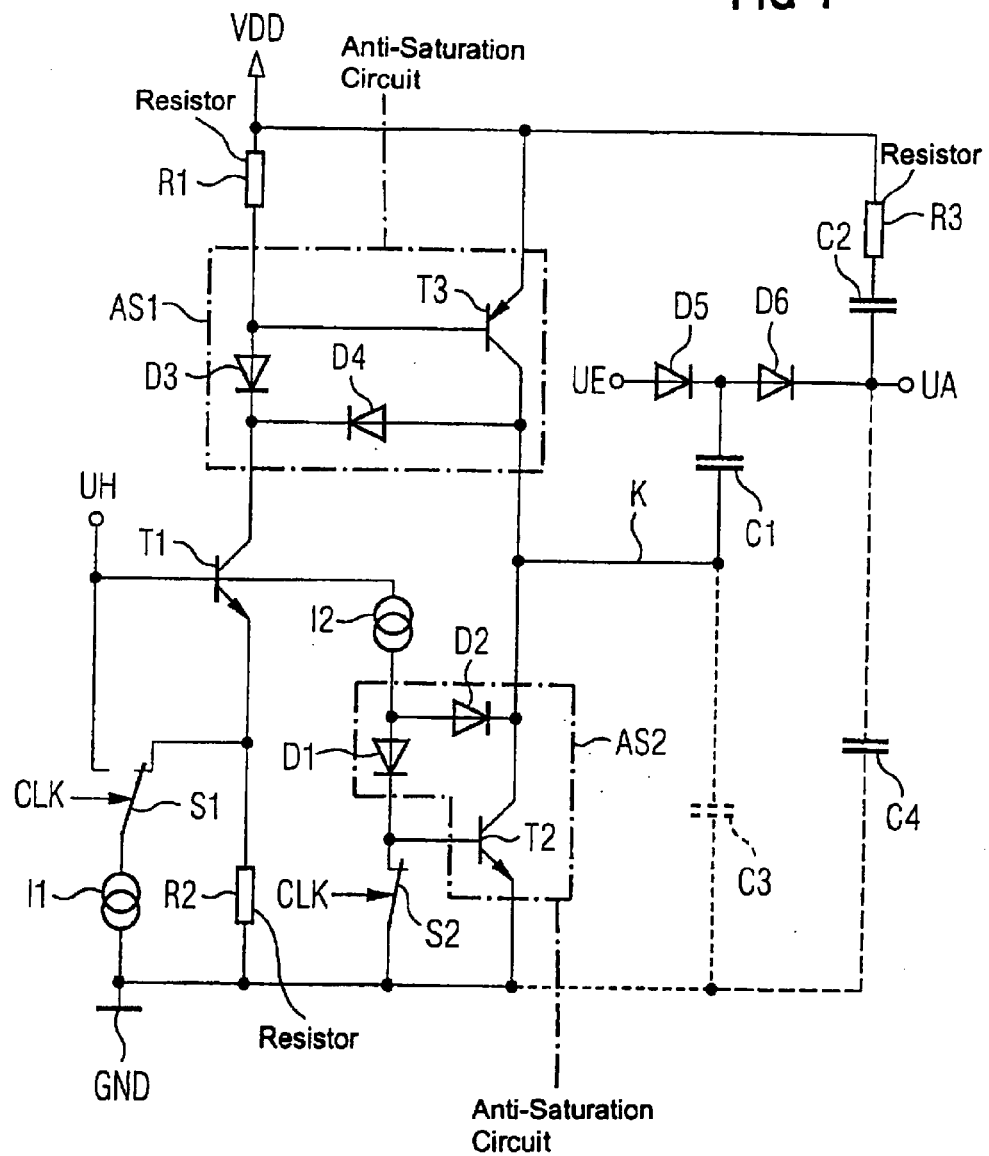
FIG. 1 is a circuit diagram of a first embodiment of a charge pump circuit.

Referring now to the figures of the drawing in detail and first, particularly, to FIG. 1 thereof, there is shown a circuit diagram of a charge pump circuit that provides an output voltage UA which is greater than the supply voltage supplying the charge pump circuit. This supply voltage is applied between the supply potential VDD and the reference-ground potential GND. A first charge storage device C1 is connected between a terminal for feeding in an input voltage UE, via a diode D5, and a circuit node K. The second charge storage device C2 is connected, via a diode D6, to the first charge storage device and, on the other hand, via a resistor R3 to the terminal for the supply voltage VDD. The node K is alternately put at the supply potential VDD and the reference-ground potential GND by the bipolar transistors T2, T3, which are embodied as switching amplifiers and are operated in a common-emitter connection. For this purpose, the base terminals of the bipolar transistors T2, T3 are coupled to a terminal for feeding in a high-frequency signal with a pump frequency CLK. A drive circuit S1, S2 drives the bipolar transistors T2, T3 in such a way that in a first clock phase, while the high-frequency signal CLK is equal to zero, the transistor T2 is switched on and the transistor T3 is switched off or blocked. Accordingly, the circuit node K is practically at reference-ground potential GND. The first charge storage device C1 is charged with the input voltage UE via diode D5. In a second clock phase, i.e. when the high-frequency signal CLK is equal to one, the transistor T2 turns off, while transistor T3 is switched on. Consequently, the circuit node K is connected with low resistance to the potential of the supply voltage VDD and with high resistance to the reference-ground potential GND. Accordingly, the node K is practically at the potential of the supply voltage VDD during the second clock phase. Accordingly, the charge storage deviced in the charge storage device C1 is transferred to the second charge storage device C2 via the forward-biased diode D6. An output voltage UA is available which corresponds to the sum of supply voltage VDD and input voltage UE. In this case, the output voltage is higher than the breakdown voltage of an individual charge storage device C1, C2. Provided between the charge storage device C2 and the terminal for the supply voltage VDD is a resistor R3, which protects the second charge storage device C2 against instances of electromagnetic coupling-in or electrostatic discharges. The second charge storage device C2 is designed as a poly-poly capacitor and the first terminal thereof is connected to the terminal for the output voltage UA, so that the leakage capacitance occurring between the terminal of the second charge storage device C2 and the substrate forms an additional smoothing capacitance C4 connected between the terminal for the output voltage UA and the reference-ground potential GND. An additional, parasitic leakage capacitance C3 is depicted between the first charge storage device C1 and the reference-ground potential terminal GND.

An anti-saturation circuit AS1, AS2 is in each case connected to the bipolar transistors T2, T3. The anti-saturation circuit includes the relevant bipolar transistors T2, T3. In this case, these anti-saturation circuits AS1, AS2 prevent the transistors T2, T3 from attaining saturation. Two diodes D3, D4 are provided for the bipolar transistor T3 designed as a PNP transistor. The cathode terminals of these diodes D3 and D4 are connected to one another and the anode terminals are respectively connected to the base terminal and the collector terminal of the transistor T3. A drive circuit for driving the third transistor T3 with the high-frequency signal CLK is connected to the common cathode terminal of the diodes D3, D4. The bipolar transistor T2 designed as an NPN transistor has two diodes D1, D2 for preventing saturation. The anode terminals of the diodes D1, D2 are connected to one another and their cathode terminals are respectively connected to the base and to the collector terminal of the transistor T2. The transistor T2 is also connected to the drive circuit to be driven with the high-frequency signal CLK.

The drive circuit for driving the transistors T2, T3 with the high-frequency signal CLK includes a first switch S1 and also a second switch S2, which can be driven with the high-frequency signal CLK, and also a first and a second current source I1, I2. By using a further bipolar NPN transistor T1 having a control input (base) connected to an auxiliary voltage terminal UH, the switches S1, S2 and also the current sources I1, I2 are protected against high voltages and can thus be constructed from standard CMOS components in a current- and area-saving manner. The emitter terminal of the additional bipolar transistor T1 is connected to the reference-ground potential GND via a resistor R2 to set a very small quiescent current, for example 1 µA, through the transistor T1, and to ensure that the emitter-base junction of the high-voltage NPN transistor T1 always remains forward-biased. The auxiliary voltage UH is stabilized with regard to fluctuations of the supply voltage VDD.

The above-described charge pump circuit with the above-described anti-saturation circuits AS1, AS2 limits the collector-emitter voltage of the transistors T2, T3 to voltage values of greater than 300 mV in all operating states, so that, by way of this effective prevention of saturation, the current consumption of the circuit arrangement is reduced by the product of the saturation charge and the pump frequency of the high-frequency signal CLK. Moreover, by way of the anti-saturation circuit described, an injection of substrate current, in particular at high temperatures, is avoided and, consequently, the current consumption of the charge pump circuit is reduced further and the temperature response is improved. The charge pump circuit shown in FIG. 1 can be operated at high pump frequencies, for example, greater than 1 MHz, in order to generate an output voltage UA with a small internal resistance and a low voltage ripple. The input and auxiliary voltages UE, UH may be identical and amount to 3 volts, for example. The supply voltage VDD may have a magnitude of tens of volts. The resistor R1, which serves for reliably switching off the transistor T3, should be designed with a high resistance, for example, with a resistance of between 50 and 100 kohms.

The bipolar transistors T1, T2, T3 and also the diodes D2, D3, D4, D5, D6 should be designed such that they are suitable for a high voltage. The capacitors C1, C2 require a dielectric strength of the order of magnitude of the input voltage UE.

In the anti-saturation circuit AS2, the base current driving the transistor T2 is conducted away through diode D2 as soon as the collector-base voltage at T2 becomes negative. Since this feedback is effected merely via a diode D2, or via a diode D4 in the anti-saturation circuit-AS1, the reaction time is improved and oscillations of the regulating arrangements are reduced. The transistors T2 and T3 are reliably switched off by the switch S2 and the resistor R1, respectively.

Instead of the diodes D1, D3, it is possible either to use resistors for setting the voltage difference at the collector terminals of the transistors T2, T3 as desired, or it is possible, instead of the diodes D1 and/or D3, to connect a plurality of diodes in series. The voltage difference or the voltage swing at the collector terminals of the transistors T2, T3 is then correspondingly reduced.

The low voltage loading of the capacitors C1, C2 in the charge pump circuit described enables a low failure frequency or a high reliability of the circuit.

The base current driving of the bipolar transistors T2, T3 insures that, by using small base currents, the bipolar transistors T2, T3 have a large collector current for charging the capacitors C1 and C3. In order to achieve a collector current at the transistor T3 of 300 microamperes, for example, given a current gain β of 30, a base control current of 10 microamperes is necessary, thereby producing at the capacitor terminal of the capacitor C1 which is connected to the node K a rise time of:

$$T_r = \frac{C3 \cdot (VDD - 2 \cdot U_{BE})}{I_c} = 100 \text{ ns};$$

where $T_r$=rise time, C3=capacitance of the capacitor C3, $U_{BE}$=base-emitter voltage of the transistor T3, $I_c$=collector current at the third transistor T3, and where C3=2 pF, VDD=17 V and $U_{BE}$=0.65 V. A further advantage with regard to the total current consumption reduction is afforded by the good switch-off of the transistors T2, T3, in which the collector current is equal to zero in the switched-off state.

Figure 2:
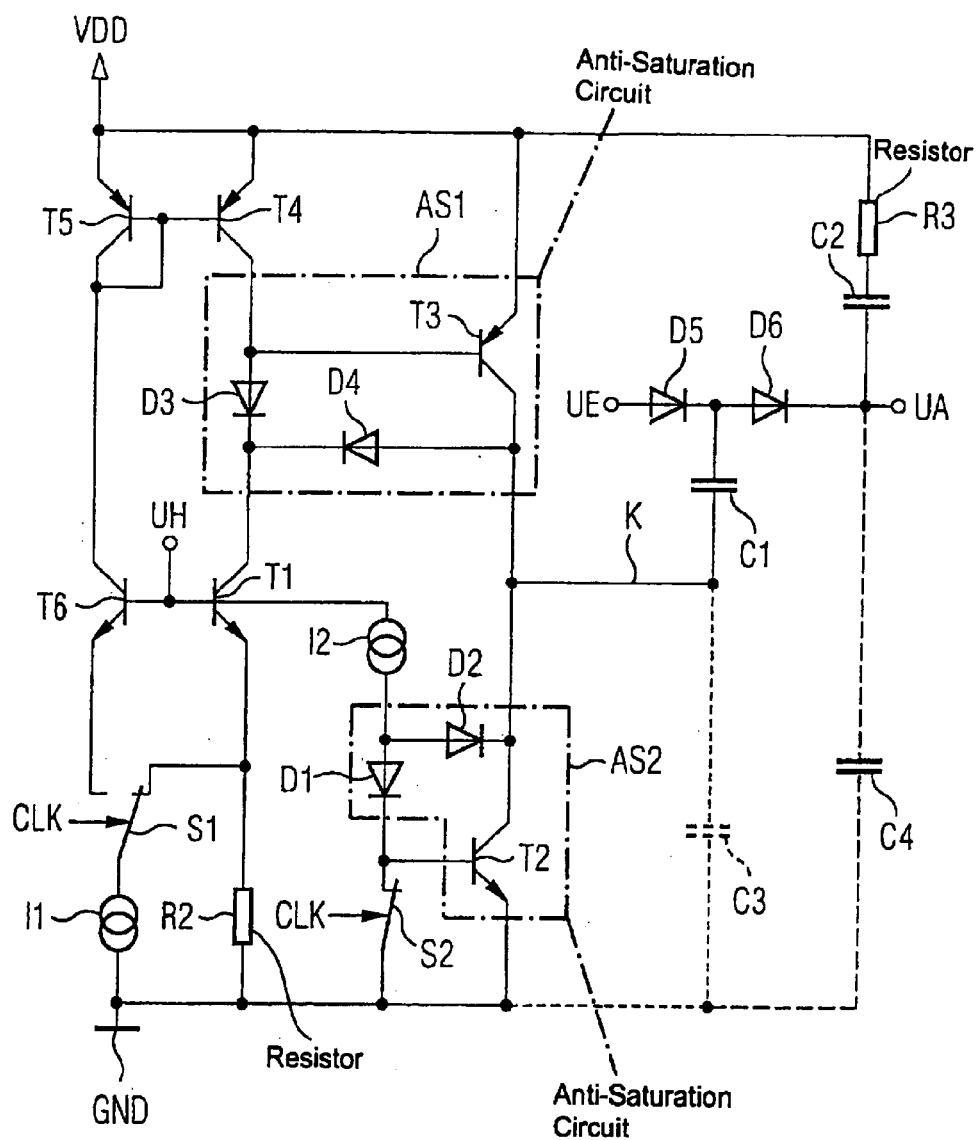
FIG. 2 is a circuit diagram of a second embodiment of the charge pump circuit.

FIG. 2 shows an alternate realization of the charge pump circuit and largely corresponds to the circuit arrangement shown in FIG. 1, but in this case the resistor R1 is replaced by a transistor T4, which forms a current mirror with a further transistor T5. This emitters of the current mirror are connected to the supply voltage VDD. Furthermore, the control side of a transistor T6 is connected to the auxiliary voltage UH, and the load side of the transistor T6 is connected to the switch S1 and to the transistor T5 of the current mirror. This further improves the blocking of the transistor T3 in the switched-off state since, via the current mirror T4, T5, a base control current is impressed which effectively blocks the base of the transistor T3. Moreover, a faster switch-off of the transistor T3 can be achieved with the current mirror T4, T5 compared with the resistor R1.

Figure 3:
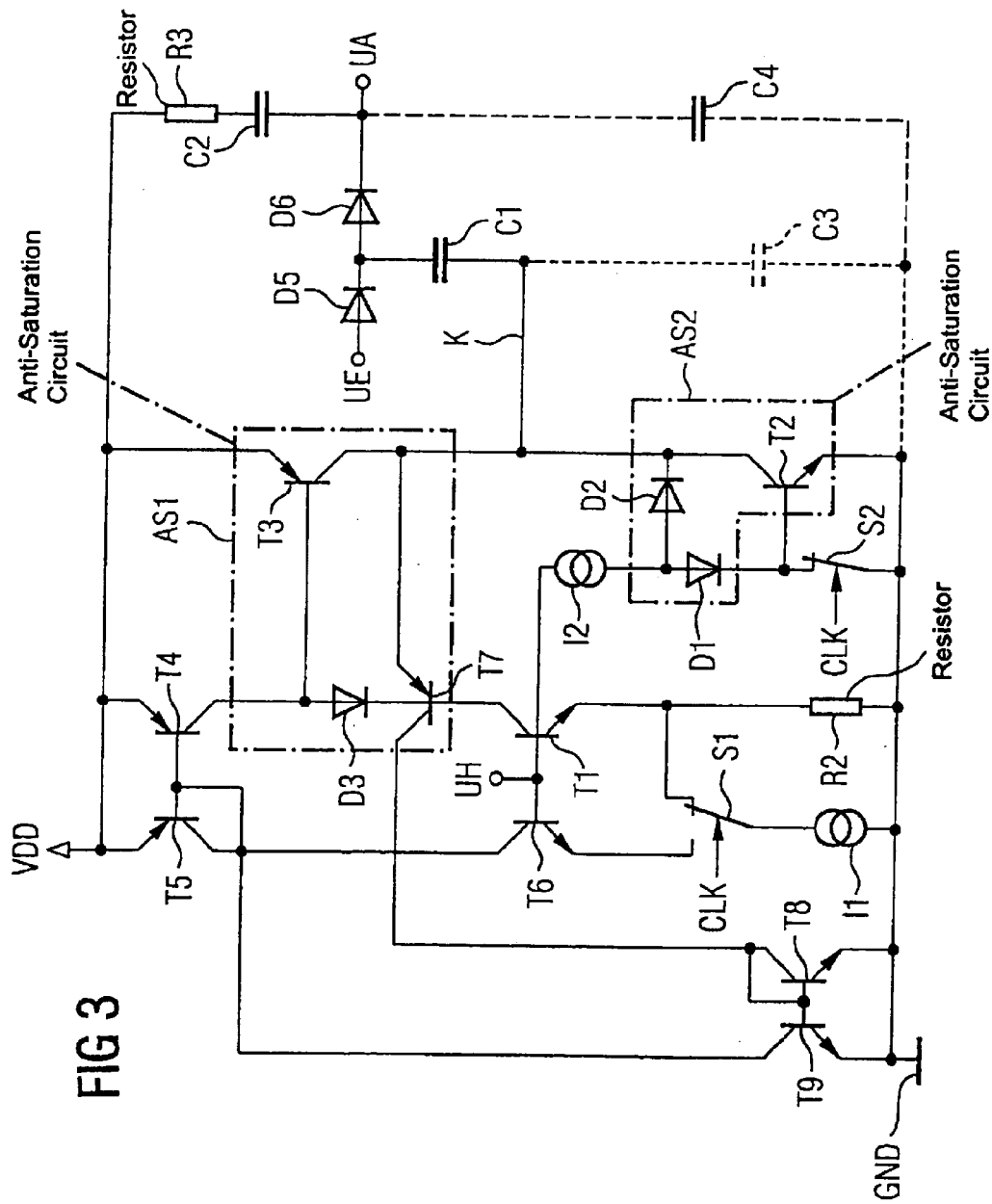
FIG. 3 is a circuit diagram of a third embodiment of a charge pump circuit.

A further alternate realization of the charge pump circuit is illustrated in FIG. 3 using a block diagram. FIG. 3 differs from FIG. 2 in that a PNP transistor T7 is provided instead of the diode D4 in the anti-saturation circuit AS1. The base of the transistor T7 is connected to the cathode terminal of the diode D3, the emitter is connected to the collector of the transistor T3, and the collector is connected to an additional current mirror T8, T9. The emitters of the current mirror T8, T9 are connected to the reference-ground potential GND. The transistor T7 is turned on as soon as the collector potential at the transistor T3 rises above the base potential thereof. The load current which then flows through transistor T7 is mirrored via the current mirrors T8, T9 and T4, T5 and switches off the transistor T3. Accordingly, the transistors T7, T8, T9, T4, T5 form a control loop for transistor T3.

Figure 4:
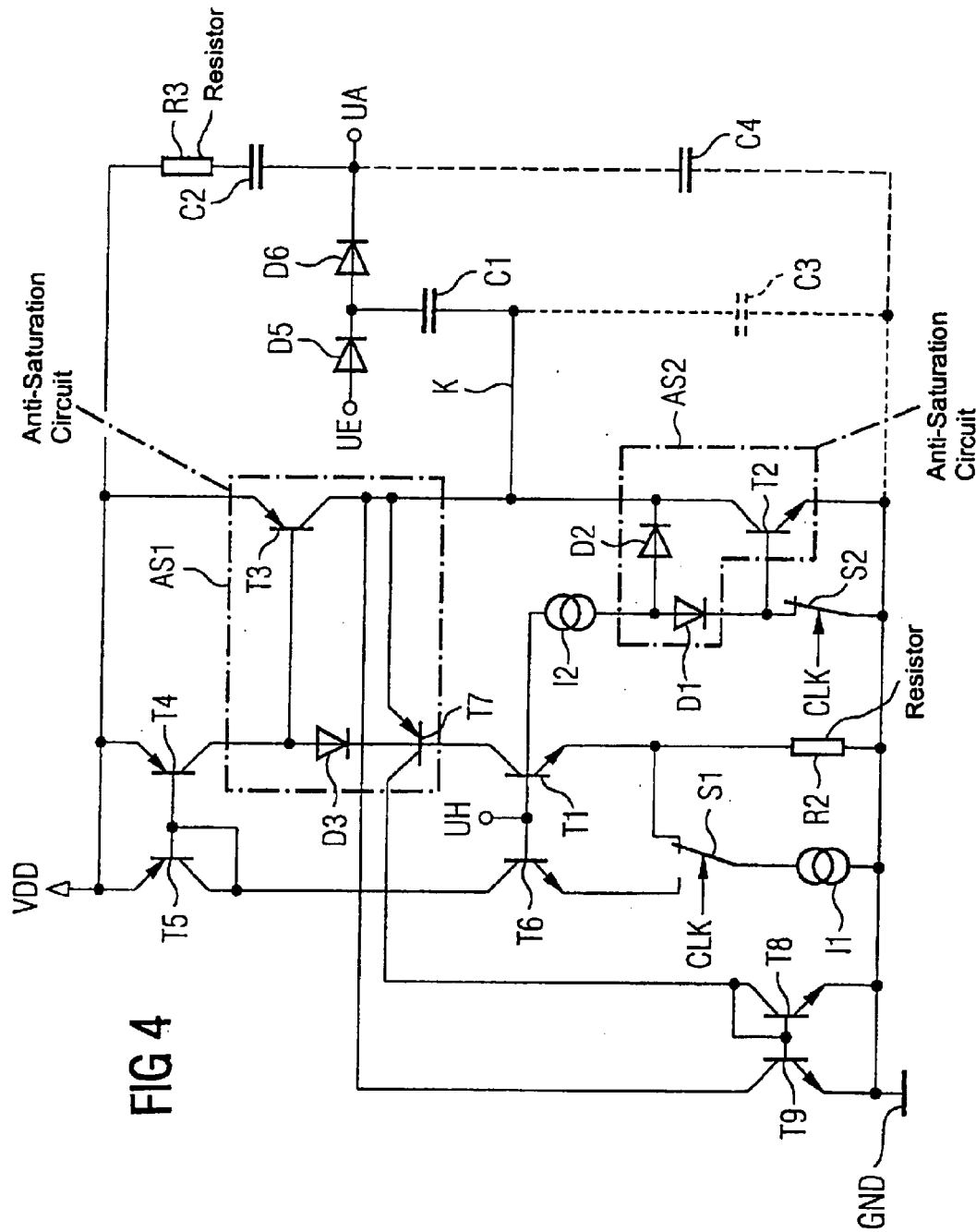
FIG. 4 is a circuit diagram of a fourth embodiment of the charge pump circuit.

FIG. 4 shows a development of the charge pump circuit of FIG. 3, in which the current mirror TB, T9 is not connected to transistor T7 and to current mirror T4, T5, but rather to transistor T7. A collector of the current mirror T8, T9 is connected to transistor T3. Such a realization of the anti-saturation circuit AS1 for the transistor T3 affords a faster feedback since the control loop only includes three transistors T7, T8, T9. The collector current of the transistor T7 is now increased greatly by the current mirror T8, T9 and is drawn directly from the collector of the transistor T3.

Figure 5:
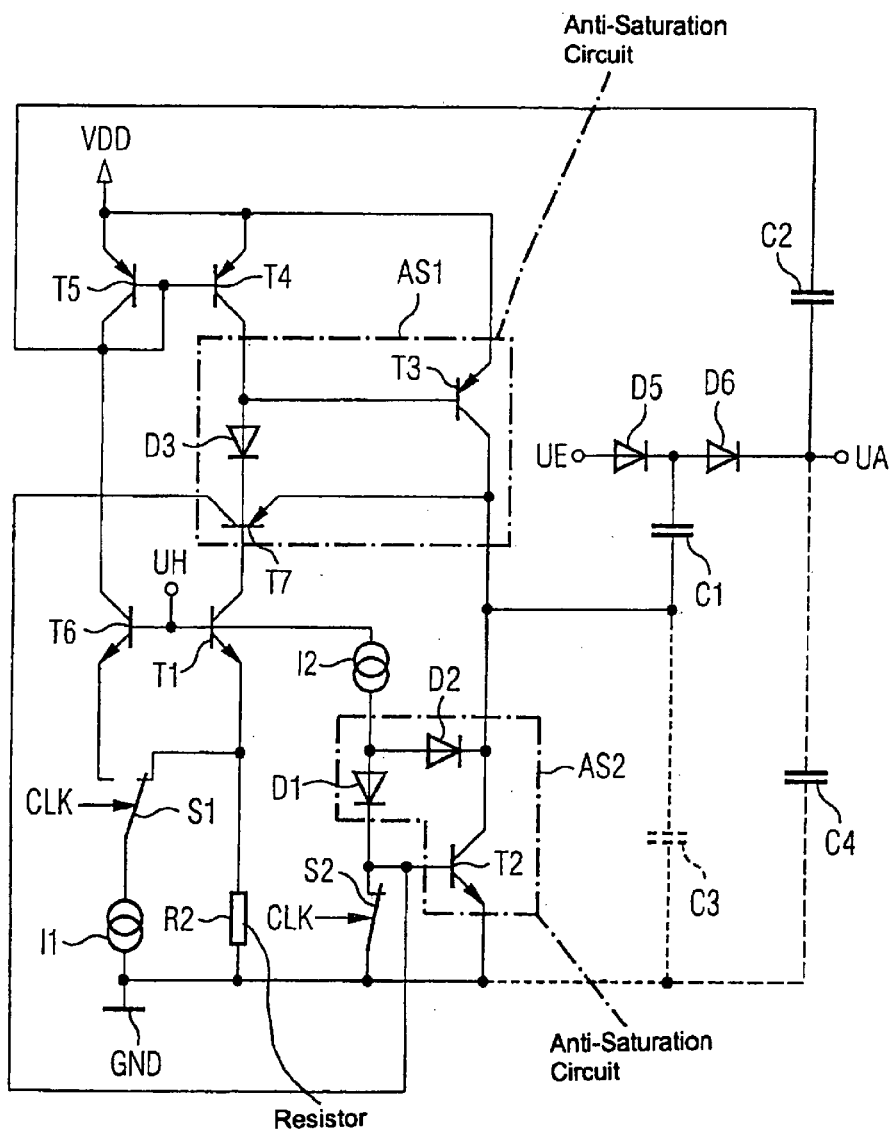
FIG. 5 is a block diagram of a fifth embodiment of the charge pump circuit.

A further circuit variant of the charge pump circuit is specified in FIG. 5. FIG. 5 shows a development of the charge pump circuit of FIG. 4, in which the current mirror T8, T9 is omitted and the collector terminal of the transistor T7 is now connected directly to the base terminal of the transistor T2. As a result of this, the phase margin of the control loop, now formed by transistors T2, T7, is improved given the same current consumption in comparison with FIG. 4. This charge pump circuit enables a very fast switch-off of the transistor T3 while utilizing the transistor T2 that is present anyway, so that the current mirror T8, T9 can be omitted. A further advantage of the charge pump circuit shown in FIG. 5 is afforded by the fact that the resistor R3 which protects the capacitor C2 can be omitted and it is thus possible to connect the capacitor C2 directly between the terminal for the output voltage UA and via transistor diode T5 to the supply voltage VDD. As an alternative to this, this connection of the capacitor C2 could also be connected to arbitrary other circuit points of the charge pump circuit or of other circuit sections in the same integrated circuit which are connected with low resistance to the supply voltage VDD.

Figure 6:
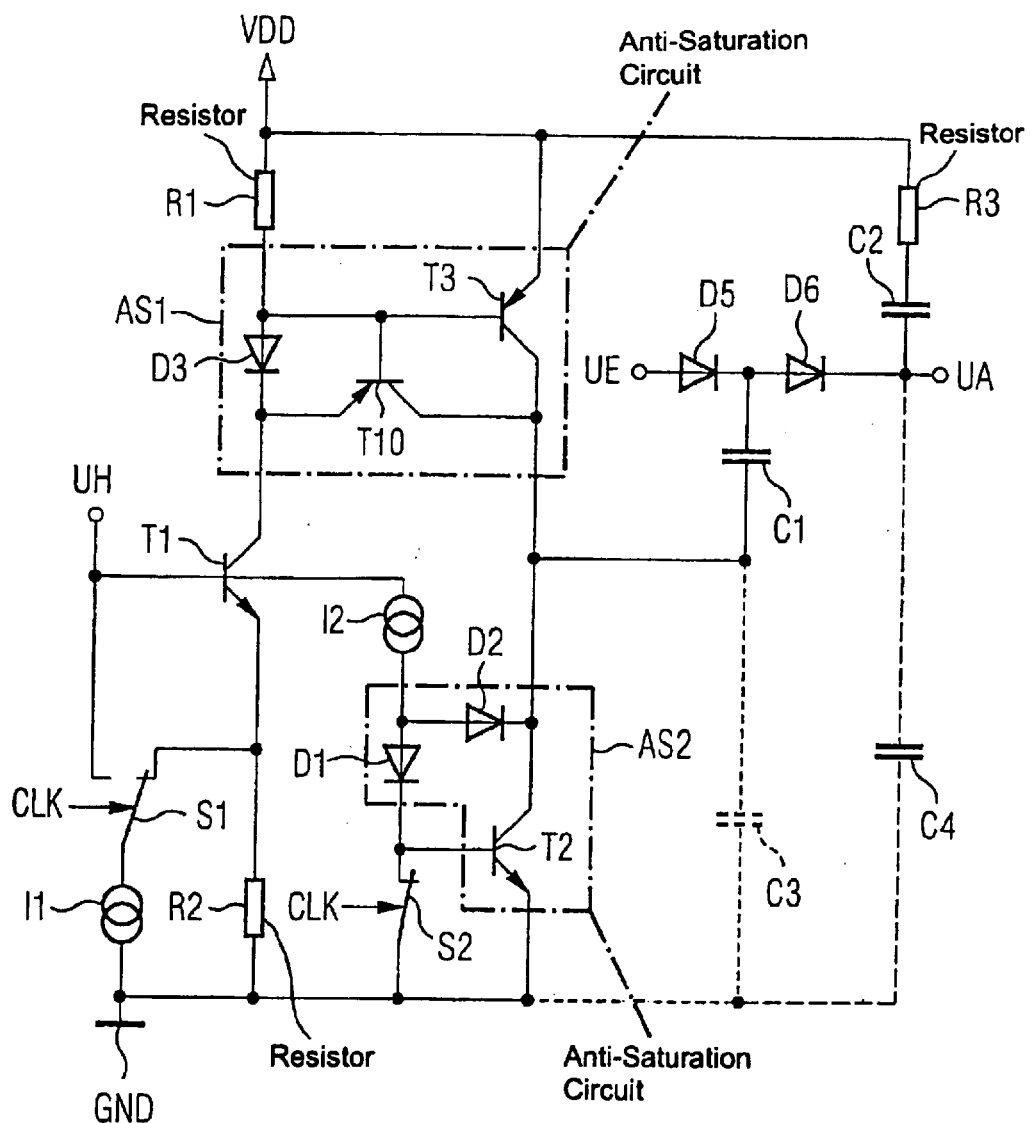
FIG. 6 is a block diagram of a sixth embodiment of the charge pump circuit.

Finally, FIG. 6 shows a last exemplary embodiment of the charge pump circuit. The latter has the difference from FIG. 1 that the diode D4 is replaced by a bipolar PNP transistor T10, whose base terminal is connected to that of the transistor T3, whose collector terminal is connected to that of the transistor T3, and whose emitter terminal is connected to the cathode terminal of the diode D3. In this case, the transistor T10 is used in inverse operation, as a result of which a saturation of the transistor T3 can likewise be prevented.

In further alternative embodiments, the diode D3 may be replaced by a resistor or may be supplemented by a resistor in series. In an analogous manner, diode D2 may be replaced by an NPN transistor, comparable with the circuitry of the transistor T10. Furthermore, the diode D1 may in this case be omitted, be replaced by a resistor, or be supplemented by a series resistor.

I claim:

1. A charge pump circuit for providing an output voltage greater than a supply voltage, the charge pump circuit comprising:
   a first diode;
   a circuit node;
   a terminal for acquiring an input voltage;
   a first charge storage device coupled, via said first diode to said terminal for acquiring the input voltage, said first charge storage device also coupled to said circuit node;
   a terminal for acquiring the supply potential;
   a terminal for acquiring a reference-ground potential;
   a second diode;
   a terminal for providing an output voltage;
   a second charge storage device coupled to said terminal for acquiring the supply potential, said second charge storage device coupled, via said second diode, to said first charge storage device, said second charge storage device connected to said terminal for providing the output voltage;
   a first anti-saturation circuit including a first switching device coupled to said terminal for acquiring the supply potential and to said circuit node, said first switching device including a bipolar transistor;
   a second anti-saturation circuit including a second switching device connected to said terminal for acquiring a reference-ground potential and to said circuit node, said second switching device including a bipolar transistor; and
   a drive circuit configured for acquiring the high-frequency signal for alternately switching on said bipolar transistor of said first anti-saturation circuit and said bipolar transistor of said second anti-saturation circuit;
   said bipolar transistor of said first anti-saturation circuit constructed as a switching amplifier having a control input connected to said drive circuit;
   said bipolar transistor of said second anti-saturation circuit constructed as a switching amplifier having a control input connected to said drive circuit;
   a terminal for acquiring a high-frequency signal for controlling said first switching device and said second switching device;
   said first switching device coupled to said terminal for acquiring the high-frequency signal for controlling said first switching device and said second switching device; and
   said second switching device coupled to said terminal for acquiring the high-frequency signal for controlling said first switching device and said second switching device; and
   a high-voltage protection device for protecting against high voltages, said high-voltage protection device having a control input for acquiring an auxiliary voltage, and said high-voltage protection device connecting said drive circuit to said terminal for acquiring the supply voltage.

2. The charge pump circuit according to claim 1, wherein:
   said first diode is connected to be forward biased between said terminal for acquiring the input voltage and said first charge storage device; and
   said second diode is connected to be forward biased between said first charge storage device and said second charge storage device.

3. The charge pump circuit according to claim 1, wherein:
   said bipolar transistor of said first anti-saturation circuit includes a base terminal and a collector terminal;
   said bipolar transistor of said second anti-saturation circuit includes a base terminal and a collector terminal;
   said first anti-saturation circuit includes two diodes connected back to back between said base terminal and said collector terminal of said bipolar transistor of said first anti-saturation circuit;
   said second anti-saturation circuit includes two diodes connected back to back between said base terminal and said collector terminal of said bipolar transistor of said second anti-saturation circuit; and
   said first anti-saturation circuit and said second anti-saturation circuit are connected to said drive circuit.

4. The charge pump circuit according to claim 1, wherein:
   said bipolar transistor of said first anti-saturation circuit includes a base terminal and a collector terminal;
   said bipolar transistor of said second anti-saturation circuit includes a base terminal and a collector terminal;
   said first anti-saturation circuit includes two diodes connected back to back between said base terminal and said collector terminal of said bipolar transistor of said first anti-saturation circuit;
   said second anti-saturation circuit includes two diodes connected back to back between said base terminal and said collector terminal of said bipolar transistor of said second anti-saturation circuit; and
   said first anti-saturation circuit and said second anti-saturation circuit are connected to said drive circuit.

5. The charge pump circuit according to claim 4, further comprising a resistor connected between said base terminal of said bipolar transistor of said first anti-saturation circuit and said terminal for acquiring the supply potential.

6. The charge pump circuit according to claim 4, further comprising:
   a terminal for acquiring an auxiliary voltage; and
   a current mirror connected to said base terminal of said transistor of said first anti-saturation circuit and to said terminal for acquiring the supply voltage;
   said current mirror also coupled to said terminal for acquiring the auxiliary voltage.

7. The charge pump circuit according to claim 1, wherein:

said first charge storage device includes a dielectric and two polysilicon regions isolated from one another by said dielectric; and said second charge storage device includes a dielectric and two polysilicon regions isolated from one another by said dielectric of said second charge storage device.

* * * * *